Dec. 21, 1965 C. NEITZERT 3,225,219

MONOSTABLE PULSE GENERATOR EMPLOYING DELAYED SWITCH MEANS SHUNTING TUNNEL DIODE FOR CONTROLLING STATE THEREOF

Filed Aug. 7, 1963

INVENTOR.
CARL NEITZERT

BY John V. Regan
Attorney 3,225,219

MONOSTABLE PULSE GENERATOR EMPLOYING DELAYED SWITCH MEANS SHUNTING TUNNEL DIODE FOR CONTROLLING STATE THEREOF

Carl Neitzert, Haddonfield, N.J., assignor to Radio Corporation of America, a corporation of Delaware Filed Aug. 7, 1963, Ser. No. 300,532
4 Claims. (Cl. 307—88.5)

This invention relates to pulse generators and, in particular, to a one-shot pulse circuit capable of generating a pulse of predetermined duration regardless of the duration of an applied input signal.

Many prior art one-shot circuits employ a capacitor which is charged (or discharged) in response to an applied input signal. The width or duration of the generated pulse is determined by the time required to charge the capacitor to some predetermined value, usually through an amplifying device and one or more resistance elements. Difficulty is experienced in generating pulses of very short duration because the value of the capacitor necessary for practical values of resistance becomes unmanageably small. Moreover, a variation in supply voltage or a change in the value of a circuit component due to temperature change, aging or other factors results in a change in the width of the generated pulse.

Such prior art circuits have the further disadvantage in some cases that the capacitor is discharged through a path which has a high impedance relative to the impedance of the charge path. This results in a long recovery time since the circuit cannot be triggered again until the voltage across the capacitor has reached a reference value.

It is an object of this invention to provide an improved one-shot pulse generator which does not suffer the disadvantages aforementioned.

Specifically, it is among the objects of this invention to provide an improved one-shot pulse generator in which the width of the generated pulse is not affected by changes in the values of the various circuit components and supply voltages.

It is another object of the invention to provide an improved one-shot circuit capable of generating pulses of very short duration of the order of 20 nanoseconds, for example.

It is still another object of the invention to provide an improved one-shot circuit that has a very short recovery time.

It is a further object of the invention to provide an improved one-shot circuit in which the width of the generated pulse may be either greater than, or less than, the width of the applied input signal.

Briefly stated, the invention comprises a negative resistance diode, preferably a tunnel diode, biased bistably. Input signals applied to the tunnel diode switch the diode from a first stable state to a second stable state. A signal responsive switch means is connected to shunt current away from the tunnel diode, for one operating condition of the switch means, to reduce the tunnel diode current to a low value to switch the diode to the first stable state. The input signals are applied to the switch means by way of a delay device, whereby the switch means assumes the one operating condition and switches the tunnel diode to the first state a predetermined time after the input signal has switched the tunnel diode to the second stable state.

Figure 1:
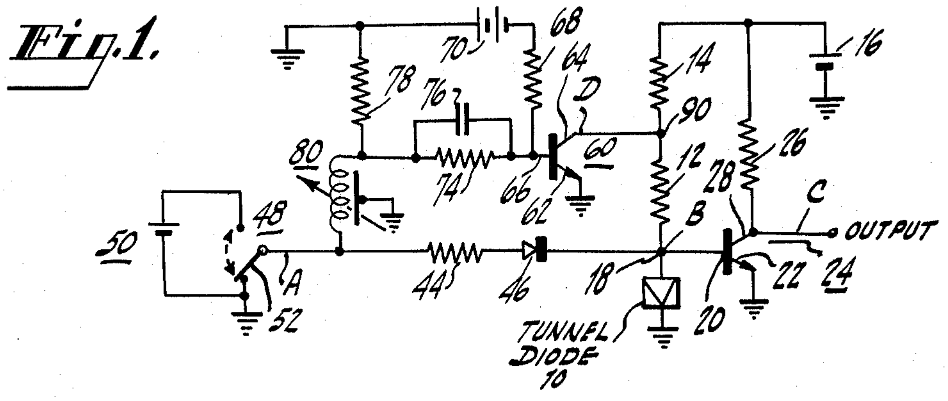
FIGURE 1 is a schematic diagram of the improved one-shot circuit.

The FIGURE 1 circuit includes the series combination of a negative resistance diode, such as the tunnel diode 10, a pair of resistance elements 12, 14 and a source of voltage, illustrated as a battery 16. Resistors 12 and 14 may be selected in value so that a substantially constant current is supplied by the battery 16 to a junction 18 at the anode of the tunnel diode. The base 20-emitter 22 junction of an NPN type transistor 24 is connected across the tunnel diode 10, and a collector supply resistor 26 is connected between the collector 28 and the positive terminal of the battery 16.

Figure 2:
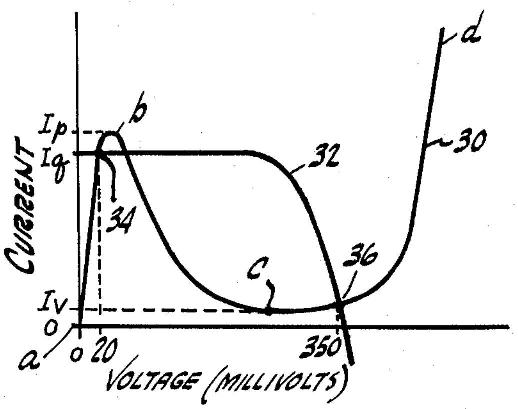
FIGURE 2 is a volt-ampere operating characteristic of a tunnel diode useful in explaining the operation of the one-shot circuit.

The volt-ampere characteristic 30 of a typical tunnel diode is illustrated in FIGURE 2. In FIGURE 2, current is potted along the ordinate, and voltage, in millivolts, is plotted along the abscissa. The load line 32 for the tunnel diode is determined by the values of the resistors 12 and 14, the voltage source 16, and the base input characteristic of the transistor 24. These values are selected so that the load line 32 intersects the first positive resistance region *ab* of the characteristic 30 at a point 34 of low voltage and intersects the second positive resistance region *cd* at a point 36 of high voltage, relatively speaking. The points 34 and 36 are points of stable operation and may have corresponding voltage values of 20 and 400 millivolts, respectively, depending upon the type of tunnel diode used. Load line 32 also intersects the characteristic 30 at a point in the negative resistance region *bc*, which point is an unstable operating point.

Tunnel diode 10 normally is biased at the stable operating point 34 in the low voltage region. The voltage across the diode 10 then is insufficient to bias the transistor 24 into conduction, whereby the output voltage at the collector 28 has a high positive value. Tunnel diode 10 may be switched to the high voltage stable state, point 36, by increasing the current through the diode 10 to a value greater than $I_p$, corresponding to the peak *b* on the characteristic curve 30. Once switched, the tunnel diode remains stably biased at the point 36 of high voltage until the diode current is reduced below a value $I_v$, corresponding to the valley current at point *c* of the characteristic. The voltage across the diode 10 in the high voltage state is sufficient to bias the transistor 24 into heavy conduction, and the output voltage at the collector 28 then is close to ground potential.

Input signals for switching the diode 10 from the low voltage state to the high voltage state are coupled to the anode junction 18 through a resistor 44 and a undirectional coupling device 46, which may be a semiconductor diode. Coupling diode 46 isolates the tunnel diode 10 from the signal input means when no input signal is being applied so that the supply current from battery 16 is not diverted from the tunnel diode. The signal input means is illustrated as a switch 48 having one terminal connected to ground directly and having a second terminal connected to the positive terminal of a battery 50. Switch 48 is illustrative only and is meant to represent various signal sources which may be employed. In actual practice, the switch 48 may be a transistor circuit, for example.

In order to reset the tunnel diode 10 to the low voltage state, there is provided a signal responsive switch means in the form of an NPN transistor 60 having its emitter 62 grounded and having its collector 64 connected to the junction 90 between resistors 12 and 14. Transistor 60 normally is biased in a non-conducting condition by connecting a resistor 68 between the base 66 and the negative terminal of a battery 70. Base 66 also is connected to ground through the parallel combination of a resistor 74 and capacitor 76, in series with a resistor 78. A delay means 80, which may be variable, is connected between the signal input switch arm 52 and the junction of resistors 74 and 78. Delay means 80 may be, for example, a section of transmission line, a lumped constant LC delay line, or the like, and may have taps thereon or other means for providing variable delay. Resistor 78 is chosen in value to terminate the delay means 80 in its characteristic impedance and prevent reflections when the delay means 80 is a transmission line.

Figure 3:
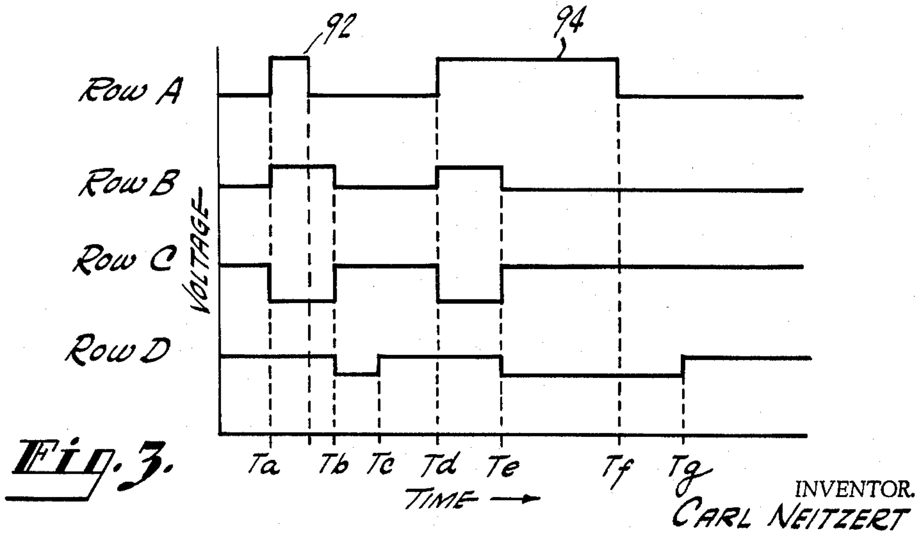
FIGURE 3 is a timing diagram in which the waveforms of voltage at various points in the circuit are illustrated as a function of time.

Consider now the operation of the circuit and refer to the timing diagram in FIGURE 3. The voltage waveforms on rows A . . . D of FIGURE 3 are idealized waveforms of voltage appearing at correspondingly designated points in the FIGURE 1 circuit. Initially, switch arm 52 is the downward position, as illustrated, in contact with the grounded switch contact. This is the no-signal input condition. Tunnel diode 10 is in the low voltage state and transistors 24 and 60 are nonconducting.

A positive input signal 92 (Row A) is applied to the circuit at a time $T_a$ by moving switch arm 52 to the upper position, in electrical contact with the positive terminal of battery 50. The positive signal forward biases the unidirectional conducting device 46 and current, in the conventional sense, flows from battery 50 to the tunnel diode 10. The input signal voltage is chosen to be of sufficient magnitude to increase the diode 10 current above the peak value $I_p$ (FIGURE 2) and switch the diode to the high voltage state (Row B). Output transistor 24 then turns on and the output voltage (Row C) falls close to ground potential.

The input pulse (Row A) is applied to the base of the transistor 60 by way of the delay means 80, and reaches the base 66 at a time $T_b$, driving transistor 60 into saturation. The interval of time $T_b-T_a$ is determined by the delay means 80. When transistor 60 saturates, its collector voltage (Row D) falls close to ground potential, and the collector 64-emitter 62 path provides a very low impedance between the point 90 and circuit ground, shunting a sufficient portion of the current from the battery 16 to ground to reduce the tunnel diode 10 current below the value $I_v$. Tunnel diode 10 then switches back to the low voltage state (Row B) and the transistor 24 turns off (Row C). Resistor 12, although not essential to the operation of the circuit, is provided to isolate the capacitance of the transistor 60 from the tunnel diode 10, permitting faster switching of the tunnel diode 10 from one state to the other state.

Transistor 60 turns off at a time $T_c$, which follows the termination of the input pulse 92 by an amount equal to the delay furnished by delay means 80. In actual practice, there may be some additional delay in turning off transistor 60 due to minority carrier storage effects therein. A second input pulse may be applied to the circuit after time $T_c$. Thus, in the example given, the recovery time is $T_c-T_b$ and is equal to the duration of the input pulse 92. Recovery time may be reduced by reducing the width of the input pulse.

It will be noted that, in the example given, the duration of the input pulse 92 is less than the delay provided by delay means 80. However, this is not a requirement for proper circuit operation, as may be seen by considering a second example. Consider now that the switch arm 52 is thrown to the upper position, in electrical contact with the battery 50, at $T_d$ (Row A). Positive current then is supplied through resistor 44 and unidirectional conducting device 46 to switch the tunnel diode 10 to the high voltage state (Row B). Transistor 24 is driven into heavy conduction and its output voltage (Row C) falls close to ground potential. Transistor 60 turns on at a time $T_e$, after a delay $T_e-T_d$ determined by the delay means 80. The voltage at the collector 64 of transistor 60 falls close to ground potential (Row D) and transistor 60 provides a low impedance path between point 90 and ground.

The input pulse 94 is still present at this time and positive current continues to flow from battery 50 to the junction 18 at the anode of tunnel diode 10. A portion of this current is shunted to ground through resistor 12 and the collector 64-emitter 62 path of the transistor 60; the remainder flows into the tunnel diode 10. Resistors 12 and 44 are chosen in value so that sufficient input current is shunted through the transistor 60 to lower the tunnel diode 10 current below the valley value $I_v$ (FIGURE 2). (If necessary, the emitter 62 of transistor 60 can be returned to a point of slight negative potential instead of directly to ground). Tunnel diode 10 switches to the low voltage state at $T_e$ (Row B) and the output transistor 24 turns off (Row C). A small amount of the input current from the battery 50 continues to flow through the tunnel diode 10 until time $T_f$, when the input pulse 94 is terminated. This current, however, is less than the valley current $I_v$. The greater portion of the input current flows through resistor 12 and the transistor 60 to ground.

Transistor 60 turns off at a time $T_g$, where $T_g-T_f$ is the delay of the delay means 80. The circuit is then ready to be triggered again. The recovery period of the circuit in the latter example is the period $T_f$ to $T_g$, and is equal to the delay of the delay means 80.

It may be seen in the above examples that the width of the generated output pulse (Row C) is independent of the width of the applied input pulse. Assuming that the input pulse has a steep leading edge, the width of the output pulse is determined almost entirely by the delay means 80. The width of the output pulse is independent, for practical purposes, of any fluctuations in supply voltages and any changes in the values of the various resistors and other components, inasmuch as there is no capacitor which need be charged (or discharged) to some predetermined value. The output pulse terminates when transistor 60 is driven into saturation, and the particular time at which this occurs is a function of the delay provided by the delay means 80.

Using an input pulse having a rise time of 10 nanoseconds, an output pulse (Row C) with a base width as narrow as 20 nanoseconds can be obtained when the circuit values and components are as follows. It will be understood that these values are by way of illustration only.

| Resistors: | Ohms |
|---|---|
| 12 | 33 |
| 14 | 820 |
| 26 | 220 |
| 44 | 680 |
| 68 | 56 K |
| 74 | 1.2 K |
| 78 | 82 |
| Delay means 80 | 70 ohm delay line |
| Transistors: | |
| 24 | 2N955A |
| 60 | 2N2475 |
| Tunnel diode 10 | 2N2475 |
| Voltage sources: | Volts |
| 16 | 3 |
| 50 | 3 |
| 70 | −25 |

What is claimed is:

1. The combination comprising:

a negative resistance diode having a volt-ampere characteristic characterized by two regions of positive resistance joined by a region of negative resistance;

means connected to said diode for biasing it bistably;

input signal means coupled to said diode and being operable to supply a signal to set said diode;

signal operated switch means connected between the terminals of said diode and being operable in response to a signal from said input signal means to reset said diode; and delay means coupled between said input signal means and said switch means.

2. The combination comprising:

a tunnel diode having a peak current and valley current;

means connected to said diode for biasing it bistably;

input signal means coupled to said diode and providing signals having an amplitude to increase the diode current above the peak value;

signal operated switch means connected between the terminals of said diode and being operable in one condition to provide a path in shunt with said diode for reducing the diode current below the valley current value; and delay means coupled between said input signal means and said switch means and being operable to delay the switching of said switch means to said one condition for a predetermined time after the input signals are applied to said diode.

3. The combination comprising:

a tunnel diode;

means connected to said tunnel diode for biasing it bistably, whereby said tunnel diode has a first stable state at low voltage and a second stable state at high voltage, relatively speaking;

signal input means coupled to said tunnel diode;

a transistor having a collector-emitter path connected between the terminals of said tunnel diode; and delay means coupled between said signal input means and the base of said transistor, said signals from said input means having an amplitude and polarity to switch said tunnel diode from the low voltage state to the high voltage state and to drive said transistor into saturation, said transistor being operable to switch said tunnel diode from the high voltage state to the low voltage state when said transistor is driven into saturation.

4. The combination comprising:

a tunnel diode having one terminal connected to a point of fixed potential;

means connected across said tunnel diode for biasing it bistably, said means including a first resistor and a second resistor connected in series between the other terminal of said tunnel diode and said point of reference potential;

signal input means coupled to said tunnel diode;

a transistor having a collector-emitter path connected between the junction of the first and second resistors and said point of reference potential;

bias means connected between the base and emitter of said transistor for quiescently biasing said transistor in a nonconducting condition;

delay means connected between said signal input means and the base of said transistor, said signal input means supplying signals having an amplitude and polarity to increase the current through said tunnel diode and to bias said transistor into heavy conduction; and output means connected across said tunnel diode.

References Cited by the Examiner

UNITED STATES PATENTS

| | | | |
|---|---|---|---|
| 2,212,967 | 8/1940 | White | 328—204 |
| 3,091,705 | 4/1963 | Levine | 307—88.5 |

ARTHUR GAUSS, *Primary Examiner.*